United States Patent
Lyon et al.

(10) Patent No.: US 10,091,902 B2
(45) Date of Patent: Oct. 2, 2018

(54) ELECTRICAL MODULE FOR BATTERY DISTRIBUTION ASSEMBLY

(71) Applicant: TYCO ELECTRONICS CORPORATION, Berwyn, PA (US)

(72) Inventors: Zachary Wood Lyon, Winston-Salem, NC (US); Thomas Wojtacki, Greensboro, NC (US); Jeremy Christin Patterson, Winston-Salem, NC (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 162 days.

(21) Appl. No.: 14/949,330

(22) Filed: Nov. 23, 2015

(65) Prior Publication Data
US 2017/0150630 A1    May 25, 2017

(51) Int. Cl.
| | |
|---|---|
| *H05K 7/02* | (2006.01) |
| *H01H 85/20* | (2006.01) |
| *H01M 2/10* | (2006.01) |
| *H01M 10/42* | (2006.01) |
| *H01H 85/02* | (2006.01) |

(52) U.S. Cl.
CPC ........... *H05K 7/02* (2013.01); *H01H 85/2045* (2013.01); *H01M 2/1094* (2013.01); *H01M 10/425* (2013.01); *H01H 2085/025* (2013.01); *H01M 2200/103* (2013.01); *H01M 2220/20* (2013.01)

(58) Field of Classification Search
CPC ... H05K 7/02; H01H 85/2045; H01M 2/1094; H01M 10/425; H01R 13/6335
See application file for complete search history.

(56) References Cited

U.S. PATENT DOCUMENTS

| | | | | |
|---|---|---|---|---|
| 5,501,605 | A * | 3/1996 | Ozaki ................. | B60R 16/0207 174/72 A |
| 5,995,380 | A * | 11/1999 | Maue .................. | B60R 16/0238 174/254 |
| 7,704,099 | B1 | 4/2010 | Hong et al. | |
| 8,243,458 | B2 * | 8/2012 | Chen ...................... | H05K 5/061 361/728 |
| 8,808,031 | B2 | 8/2014 | Zhao | |
| 9,681,571 | B2 * | 6/2017 | Hansen ................ | H05K 7/1432 |
| 2002/0061666 | A1 * | 5/2002 | Sato ........................ | H01R 9/226 439/76.2 |

(Continued)

FOREIGN PATENT DOCUMENTS

DE    19729886 C1 * 12/1998    ............. H01H 85/02

OTHER PUBLICATIONS

International Search Report, International Application No. PCT/US2016/063003, International Filing Date Nov. 21, 2016.

*Primary Examiner* — Binh Tran
*Assistant Examiner* — Douglas Burtner

(57) ABSTRACT

An electrical module is configured to be coupled to a tray of a battery distribution assembly. The electrical module includes a housing disposed along an outer surface of the tray. The electrical module also includes at least one electrical circuit device disposed within a cavity of the housing. The electrical module further includes multiple terminals electrically connected to the at least one electrical circuit device. The terminals project outward from the housing and extend through corresponding apertures in the tray for electrically connecting to one or more electrical conductors disposed along an inner surface of the tray.

16 Claims, 6 Drawing Sheets

(56) References Cited

U.S. PATENT DOCUMENTS

| | | | |
|---|---|---|---|
| 2007/0093090 A1 | 4/2007 | Fujimaki | |
| 2008/0180884 A1 | 7/2008 | Parrish | |
| 2009/0291584 A1* | 11/2009 | Wu | H01R 13/6275 |
| | | | 439/345 |
| 2010/0021810 A1* | 1/2010 | Zhu | H01M 2/04 |
| | | | 429/175 |
| 2010/0247996 A1* | 9/2010 | Ijaz | H01M 10/0468 |
| | | | 429/120 |
| 2010/0271168 A1 | 10/2010 | Niedzwiecki et al. | |
| 2012/0156536 A1* | 6/2012 | Yamazaki | H01M 2/06 |
| | | | 429/96 |
| 2012/0164489 A1* | 6/2012 | Okada | B60L 11/1818 |
| | | | 429/7 |
| 2012/0319695 A1* | 12/2012 | Yano | H01M 2/1066 |
| | | | 324/427 |
| 2013/0101883 A1 | 4/2013 | Zhao | |
| 2013/0215576 A1* | 8/2013 | Wennberg | H05K 7/2039 |
| | | | 361/715 |
| 2014/0192457 A1 | 7/2014 | Zhao | |
| 2014/0193990 A1* | 7/2014 | Zhao | H01R 13/648 |
| | | | 439/160 |
| 2014/0295216 A1* | 10/2014 | Matsuda | H01M 2/1083 |
| | | | 429/7 |
| 2015/0031226 A1* | 1/2015 | Wisneski | H01R 13/631 |
| | | | 439/310 |
| 2015/0207130 A1* | 7/2015 | Maguire | H01M 2/1083 |
| | | | 429/97 |
| 2016/0203936 A1* | 7/2016 | Onoda | H01H 85/0241 |
| | | | 337/190 |
| 2017/0008417 A1* | 1/2017 | Yoshida | H01M 2/105 |
| 2017/0084892 A1* | 3/2017 | Lee | H01M 2/1077 |
| 2017/0194681 A1* | 7/2017 | Kim | H01M 10/6568 |

* cited by examiner

ELECTRICAL MODULE FOR BATTERY DISTRIBUTION ASSEMBLY

BACKGROUND OF THE INVENTION

The subject matter herein relates generally to electrical modules, and more specifically to electrical modules that are removably coupled to battery distribution assemblies.

Batteries, such as those for electric vehicles or hybrid vehicles, typically include a plurality of cells grouped together as a battery pack. The battery pack includes a battery distribution assembly that manages the power capacity and functionality of the battery pack. The battery distribution assembly may be mounted inside a casing of the battery pack or along an outside of the casing. The battery distribution assembly may include many electrical devices such as at least one power relay, at least one pre-charge relay, at least one pre-charge resistor, at least one capacitor, at least one fuse, a current sensor, and/or other electric devices.

Problems exist with serviceability, safety, and heat management of the electrical devices on the battery distribution assembly. For example, in some known battery distribution assemblies, the electrical devices are difficult to access for replacing and/or repairing one or more of the electrical devices. The electrical devices may be disposed on an inner surface of a housing that faces and/or abuts the battery pack or may be disposed within an internal cavity defined by the housing. In either case, servicing the battery distribution assembly may require removing the entire battery distribution assembly, which may be complex and time-consuming. Safety issues are a concern when removing one or more of the electrical devices for repairs or replacement. An operator may inadvertently fail to cut off the flow of electrical current to one or more conductors when the respective electrical device is removed from the one or more conductors, resulting in exposed electrified conductors that provide a risk for electric shock. The risk is increased if the electrical device is mounted to the battery distribution assembly in a hard-to-access location, as the operator may accidentally contact the electrified conductor while trying to remove or mount the electrical device. Referring now to thermal heat management, the electrical devices in some known battery distribution assembly are disposed proximate to one another in a closed area, such as within the casing of the battery pack. The electrical devices may generate significant heat that could damage the battery distribution assembly if the heat is not sufficiently dissipated.

A need remains for providing an electrical module and a battery distribution assembly that provides better heat management, serviceability, and/or safety.

BRIEF DESCRIPTION OF THE INVENTION

In an embodiment, an electrical module is provided that is configured to be coupled to a tray of a battery distribution assembly. The electrical module includes a housing, at least one electrical current device, and multiple terminals. The housing is disposed along an outer surface of the tray, and defines a cavity. The at least one electrical circuit device is disposed within the cavity of the housing. The multiple terminals are electrically connected to the at least one electrical circuit device within the housing. The terminals project from the housing and extend through corresponding apertures in the tray to electrically connect to one or more electrical conductors disposed along an inner surface of the tray.

In another embodiment, a battery distribution assembly is provided that includes a tray having an outer surface and an opposite inner surface. The tray holds multiple electrical conductors disposed along the inner surface. The battery distribution assembly also includes an electrical module coupled to the outer surface of the tray. The electrical module includes a housing and at least one electrical circuit device disposed within a cavity of the housing. The electrical module further includes multiple terminals electrically connected to the at least one electrical circuit device within the housing. The terminals project from the housing via corresponding slots in a bottom side of the housing. The blade terminals extend through the tray via corresponding apertures in the tray to engage and electrically connect to the electrical conductors along the inner surface of the tray.

In another embodiment, an electrical module is provided that is configured to be coupled to an outer surface of a tray of a battery distribution assembly. The electrical module includes at least one fuse, a housing, and multiple terminals. The housing includes a base and a cap. The base extends between a top side and a bottom side. The housing defines a cavity that receives the at least one fuse therein. The cavity extends at least partially through the base from the top side towards the bottom side. The cap is affixed to the top side of the base to seal the cavity. The terminals are electrically connected to the at least one fuse within the housing. The terminals project from the housing and extend through corresponding apertures in the tray to electrically connect to one or more bus bars disposed along an inner surface of the tray.

DETAILED DESCRIPTION OF THE INVENTION

Figure 1:
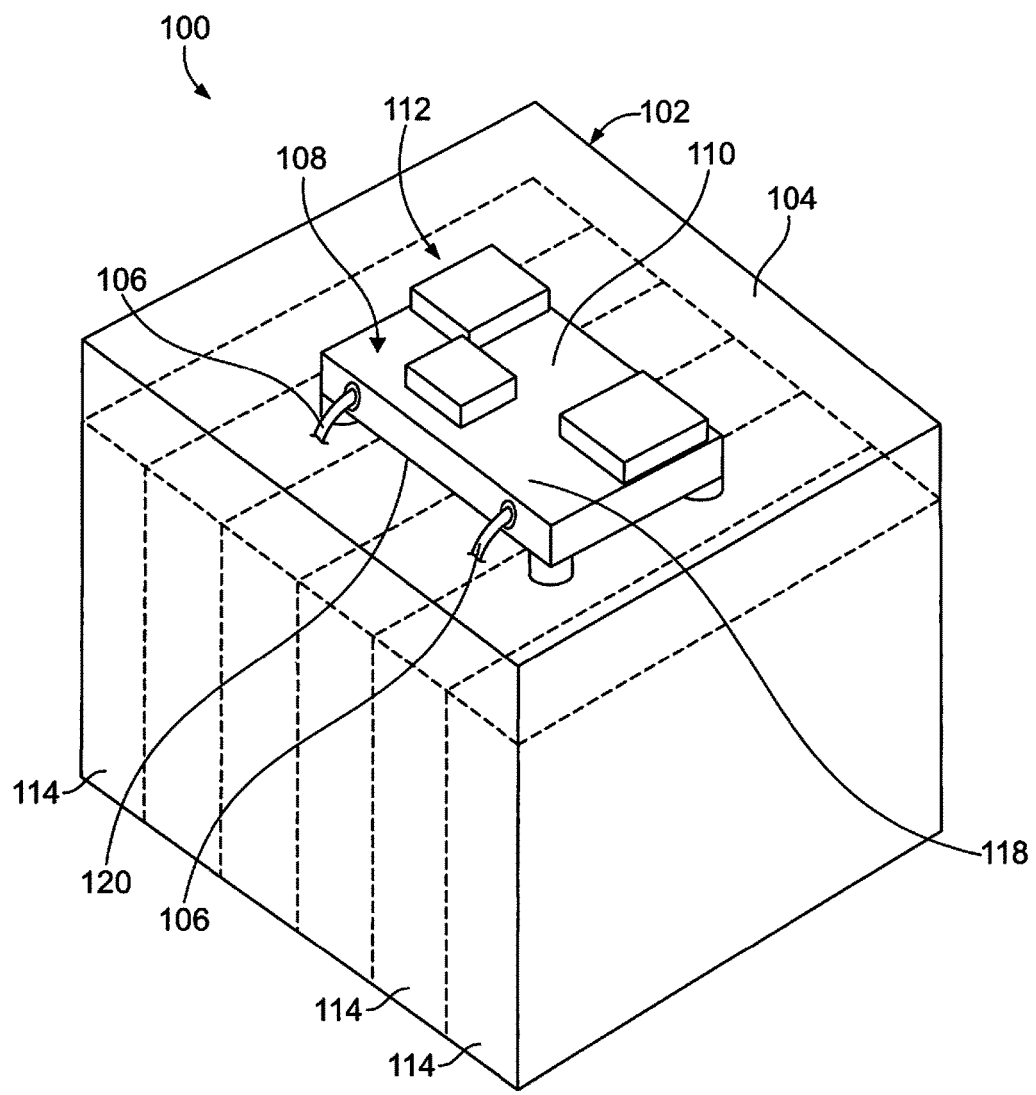
FIG. 1 illustrates a battery system formed in accordance with an exemplary embodiment.

FIG. 1 illustrates a battery system 100 formed in accordance with an exemplary embodiment. The battery system 100 includes one battery pack 102 contained within a chassis or an outer casing 104. The battery pack 102 may be part of a high voltage energy storage system. For example, the battery pack 102 may be used in an automotive application, such as part of an electric vehicle or a hybrid electric vehicle. The battery system 100 includes at least one power circuit (for example, a high current power circuit and/or a low current power circuit) electrically connected to the battery pack 102.

The battery system 100 also includes a battery distribution assembly (BDA) 108 mounted proximate to the battery pack 102. The BDA 108 is electrically connected to the battery pack 102. The BDA 108 may be mounted directly to the outer casing 104. The BDA 108 may be internal to the outer casing 104 or may be mounted to an exterior of the outer casing 104. Alternatively, the BDA 108 may be mounted to another structure spaced apart from the battery pack 102. For example, the BDA 108 may be located remote from the battery pack 102 and may be part of a centralized system that manages the individual battery pack 102 from a central location.

The BDA 108 may manage the power capacity and functionality of the battery system 100, such as by monitoring and/or controlling the power (for example, current) distribution of the battery pack 102. The BDA 108 may monitor and regulate a current flowing into or out of the battery pack 102. The BDA 108 may electrically connect a high current power circuit and/or a low current power circuit to the battery pack 102. The BDA 108 may measure and/or react to a battery health and/or a battery status of the battery pack 102. Furthermore, the BDA 108 may monitor for or react to overvoltage and/or low voltage situations of the battery pack 102. The BDA 108 may react to temperature changes of the battery pack 102 and/or may manage charging functions of the battery pack 102.

In the illustrated embodiment, the battery pack 102 includes a plurality of battery cells 114 housed within the outer casing 104. The battery cells 114 may be any type of battery cells. For example, the battery cells 114 may be pouch battery cells or prismatic battery cells. Other types of battery cells may be used in alternative embodiments. Optionally, the battery cells 114 may be narrow plates arranged in a stacked configuration. Any number of battery cells 114 may be provided in the battery pack 102. Each of the battery cells 114 may be electrically connected to the BDA 108 through an appropriate electrical connection within the battery pack 102. For example, wires 106 may extend from the BDA 108 for electrically connecting the BDA 108 to the battery pack 102.

Figure 2:
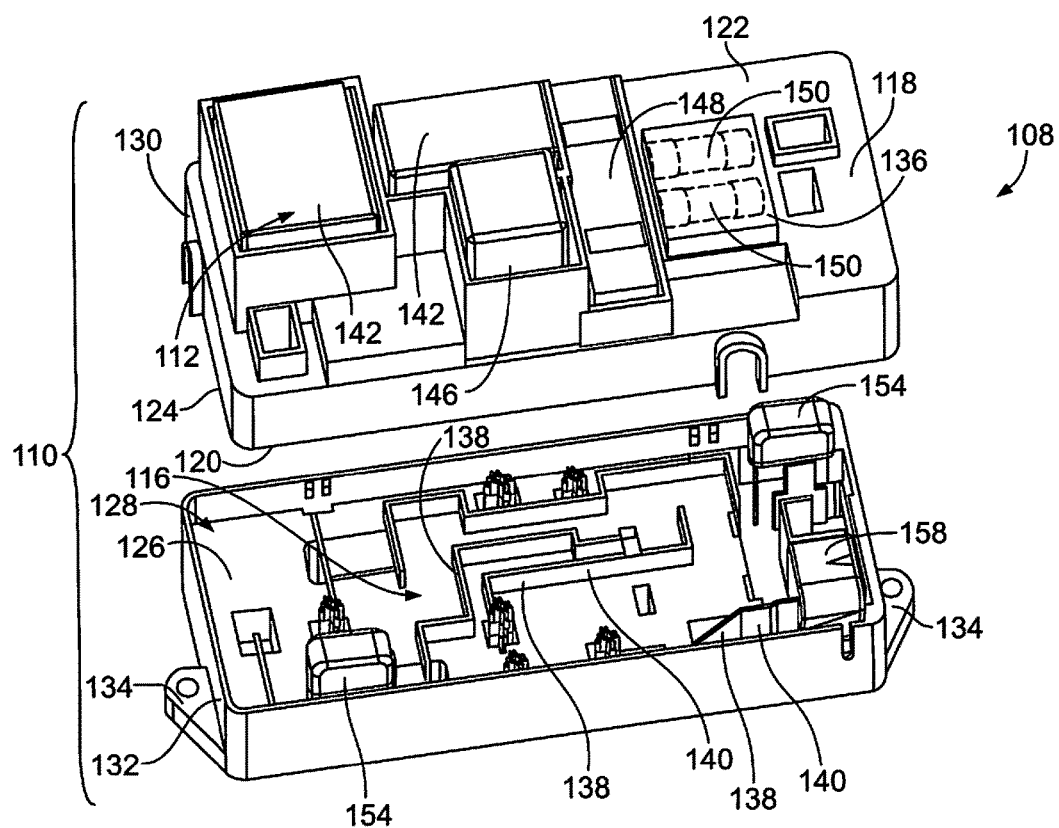
FIG. 2 is an exploded view of a battery distribution assembly of the battery system according to an embodiment.

The BDA 108 includes a tray 110 that holds a plurality of electrical circuit devices, generally shown at 112, and a plurality of electrical conductors (shown in FIG. 2). The tray 110 has an outer surface 118 and an inner surface 120. The outer surface 118 faces outward away from the battery pack 102. The inner surface 120 is disposed between the battery pack 102 and the outer surface 118. In the illustrated embodiment, the inner surface 120 is opposite the outer surface 118 and faces the battery pack 102. The electrical circuit devices 112 are held along the outer surface 118. Thus, the electrical circuit devices 112 may be exposed to ambient air that dissipates heat generated by the electrical circuit devices 112. Although not shown in FIG. 1, the tray 110 holds multiple electrical conductors 116 (shown in FIG. 2), such as conductive bus bars, terminals, receptacles, connectors, and the like. The electrical conductors 116 are disposed along the inner surface 120. The tray 110 may be manufactured from a dielectric material, such as one or more plastics or other polymers.

FIG. 2 is an exploded view of the BDA 108 according to one embodiment. In the illustrated embodiment, the tray 110 is a two-piece housing having an upper housing 130 and a lower housing 132. As used herein, relative or spatial terms such as "top," "bottom," "upper," "lower," "first," "second," "left," and "right" are only used to distinguish the referenced elements and do not necessarily require particular positions or orientations in the BDA 108 relative to gravity or in the surrounding environment of the BDA 108. The upper housing 130 is configured to be coupled to the lower housing 132. The lower housing 132 includes mounting flanges 134 for mounting the BDA 108 to the outer casing 104 (shown in FIG. 1). The BDA 108 is configured to be mounted to the outer casing 104 such that the lower housing 132 is mounted to an outside of the outer casing 104 and the upper housing 130 is spaced apart from the outer casing 104 by the lower housing 132.

The outer surface 118 of the tray 110 is defined by a top side 122 of the upper housing 130. The inner surface 120 of the tray 110 may be defined by a bottom side 124 of the upper housing 130 or, alternatively, may be defined by a top side 126 of the lower housing 132. For example, the tray 110 may define an interior chamber 128 between the bottom side 124 of the upper housing 130 and the top side 126 of the lower housing 132 when the upper and lower housings 130, 132 are coupled to one another. At least some of the electrical conductors 116 are held by the tray 110 within the interior chamber 128 between the bottom side 124 and the top side 126, such that these electrical conductors 116 are disposed along both the bottom side 124 and the top side 126. The electrical conductors 116 within the interior chamber 128 may engage and secure to the bottom side 124 of the upper housing 130, to the top side 126 of the lower housing 132, or to both the bottom side 124 and the top side 126. As used herein, a first member may be "disposed along" without necessarily mechanically engaging the second member. In an alternative embodiment, the tray 110 may be a single, unitary housing, such that the tray 110 has a thickness that extends between a top side (that defines the outer surface 118) and a bottom side (that defines the inner surface 120).

The upper housing 130 holds a plurality of the electrical circuit devices 112. For example, the electrical circuit devices 112 in the illustrated embodiment include a pair of power relays 142, a pre-charge relay 146, a pre-charge resistor 148, and a pair of fuses 150. Other types of electrical devices 112, such as capacitors and sensors, may be used in alternative embodiments. The electrical circuit devices 112 control and/or monitor current flow through the power circuit(s) defined by the BDA 108. The positioning of the electrical devices 112 may have a layout designed to minimize the footprint of the BDA 108. In an exemplary embodiment the fuses 150 are packaged in an electrical module 136. The electrical module 136 houses the fuses 150 in an internal compartment to restrict access to the fuses 150 for safety purposes. Although the electrical module 136 houses fuses 150 in the illustrated embodiment, in other embodiments the electrical module 136 houses other electrical circuit devices 112 in addition to or instead of one or more fuses 150.

The lower housing 132 holds a plurality of the electrical conductors 116. The electrical conductors 116 may include conductive bus bars 138, such as strip bus bars. The bus bars 138 are used to electrically interconnect the electrical devices 112 and may also electrically interconnect the battery cells 114 (shown in FIG. 1). For example, the bus bars 138 define electrical paths between corresponding electrical devices 112. The bus bars 138 are routed within the interior chamber 128 between the corresponding electrical devices 112 mounted to the upper housing 130. Each bus bar 138 may be formed from a conductive (for example, metal) coil strip or panel cut to length and bent into a predetermined shape. The bus bars 138 may have rectangular cross-sections along the lengths thereof. The electrical conductors 116 also include terminals, connectors, and/or receptacles associated with the bus bars 138. The terminals, connectors, and/or receptacles support the bus bars 138 and provide electrical connections between the bus bars 138 and the electrical devices 112. The bus bars 138 may be structurally supported such that the bus bars 138 are oriented generally vertically. For example, broad sides 140 of the bus bars 138 extend transverse (such as perpendicular) to a plane defined by the top side 126 of the lower housing 132. When the upper housing 130 is coupled to the lower housing 132, the electrical devices 112 along the top side 122 of the upper housing 130 are electrically connected to corresponding bus bars 138 via the terminals, connectors, receptacles, or the like. Optionally, the lower housing 132 may hold one or more electrical devices 112, such as a Y-capacitor 154 and a sensor 158. Optionally, the upper housing 130 may hold one or more bus bars 138.

Figure 3:
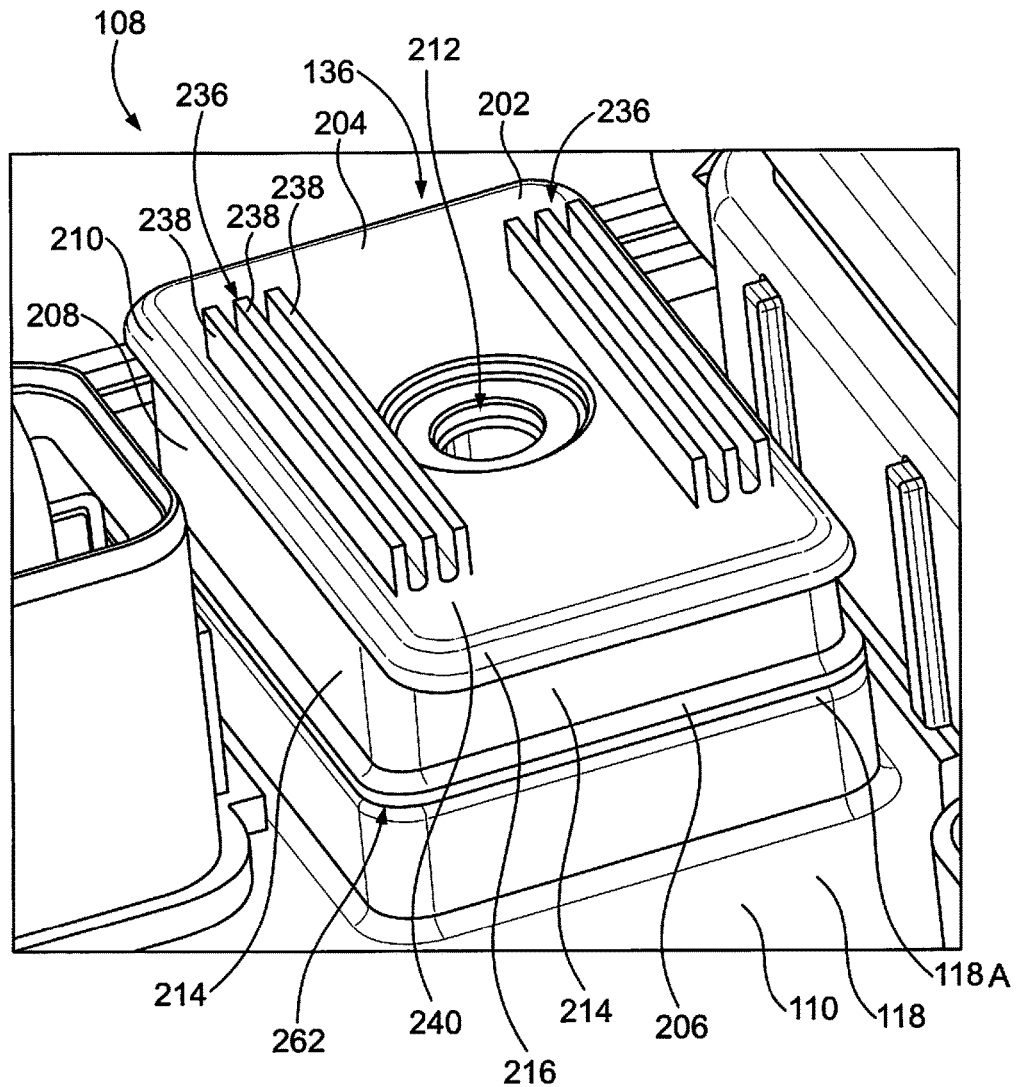
FIG. 3 is a perspective view of a portion of the battery distribution assembly showing an electrical module mounted to a tray according to an embodiment.

FIG. 3 is a perspective view of a portion of the BDA 108 showing the electrical module 136 mounted to the outer surface 118 of the tray 110 according to an embodiment. The electrical module 136 includes a housing 202 and at least one electrical circuit device 112 (shown in FIG. 2) held within the housing 202. The housing 202 extends between a top 204 and a bottom 206. The bottom 206 of the housing 202 is disposed along a raised platform 118A of the outer surface 118 of the tray 110. The raised platform 118A is optional, as the housing 202 may be disposed along a planar (non-raised) portion of the outer surface 118 in another embodiment. The housing 202 in the illustrated embodiment has a cuboid shape with rounded edges, but in other embodiments the housing 202 may have other shapes, such as cube, cylinder, cone, prism, pyramid, or the like. The housing 202 includes a base 208 and a cap 210. The base 208 defines the bottom 206 of the housing 202, and the cap 210 defines the top 204. The cap 210 is affixed to the base 208 to seal the at least one electrical circuit device 112 within the housing 202. The cap 210 may protrude laterally beyond one or more exterior sides 214 of the base 208 to define a lip 216. The lip 216 may be engaged by an operator to aid in gripping the housing 202 when mounting and removing the electrical module 136 relative to the tray 110.

In an embodiment, the electrical module 136 is removably coupled to the tray 110 in order to selectively remove and replace the electrical module 136. For example, the housing 202 (including the base 208 and the cap 210) can be removed from the raised platform 118A of the tray 110. The housing 202 may define at least one mounting hole 212 that extends fully through the housing 202 from the top 204 to the bottom 206. Only one mounting hole 212 is shown in FIG. 3. The mounting hole 212 is configured to receive a fastener (not shown) for removably coupling or securing the electrical module 136 to the tray 110. The fastener may be a screw, a bolt, a pin, or the like, that is configured to extend into a bore 160 (shown in FIG. 5) in the tray 110. Alternatively, or in addition, the electrical module 136 may be coupled to the tray 110 via a clamp, a latch, a tab, or the like that engages the housing 202 to block movement of the electrical module 136 in an unloading or uncoupling direction relative to the tray 110.

Figure 4:
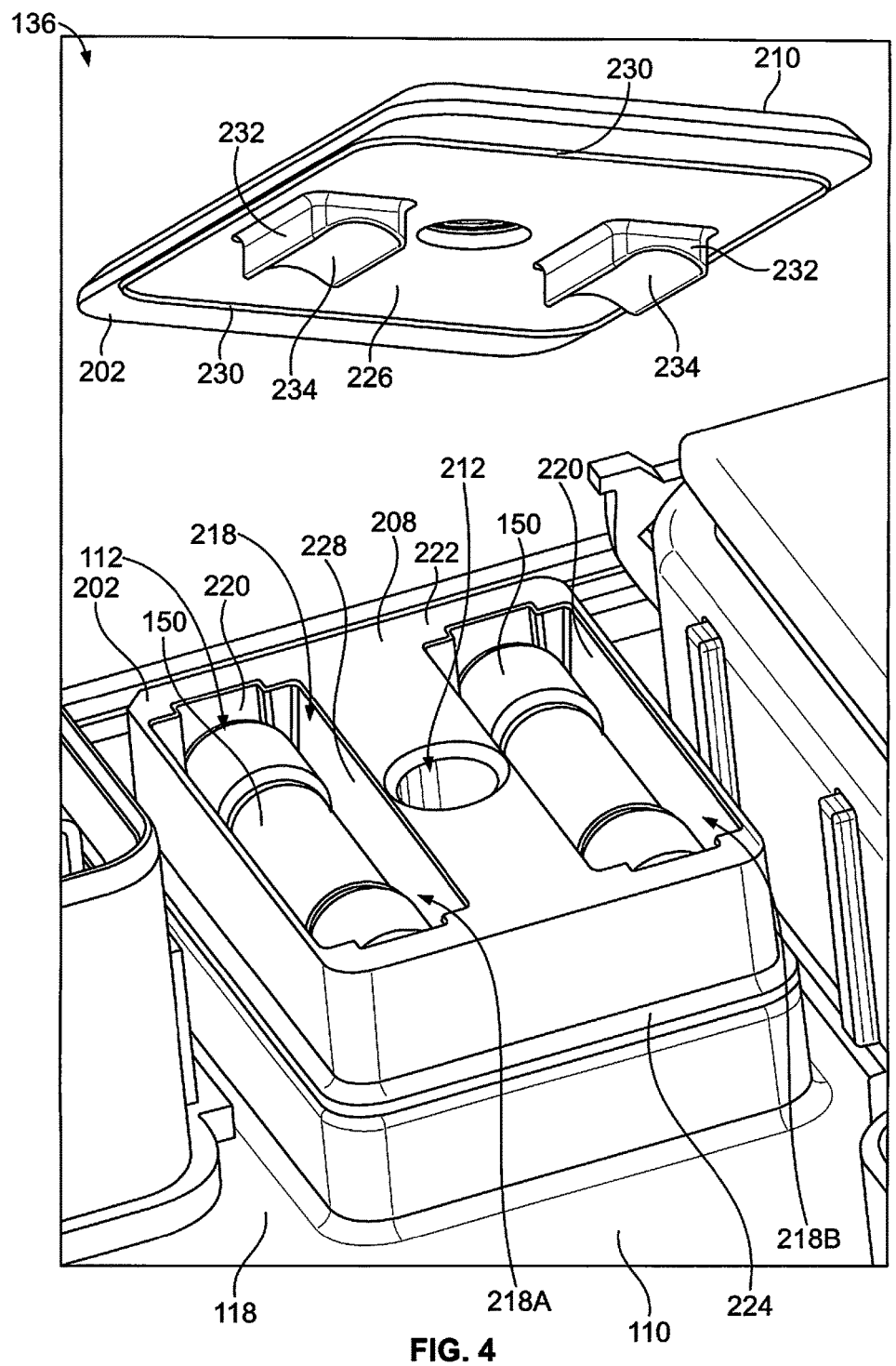
FIG. 4 is a perspective view of the electrical module according to the embodiment shown in FIG. 3 having a cap separated from a base.

FIG. 4 is a perspective view of the electrical module 136 according to the embodiment shown in FIG. 3 having the cap 210 separated from the base 208. The housing 202 defines a cavity 218 that receives the at least one electrical circuit device 112 therein. In the illustrated embodiment, the base 208 defines a substantial portion of the cavity 218. For example, the base 208 defines at least a majority of interior side walls 220 that define sides of the cavity 218. The base 208 extends between a top side 222 and a bottom side 224. The cavity 218 is defined along the top side 222 of the base 208 and extends downwards towards the bottom side 224. When the electrical module 136 is assembled, the cap 210 is affixed to the top side 222 of the base 208. The cap 210 has an interface surface 226 that abuts the top side 222 of the base 208. When sealed, the interface surface 226 of the cap 210 defines an interior top wall of the cavity 218.

In the illustrated embodiment, the at least one electrical circuit device 112 within the cavity 218 is a pair of fuses 150. In an embodiment, the fuses 150 are high current fuses. Alternatively, the fuses 150 may be low current fuses. Furthermore, in an embodiment the fuses 150 are not resettable fuses. Therefore, once one of the fuses 150 detects a fault condition (for example, a voltage or current exceeding a designated threshold) and breaks the respective circuit, that fuse 150 does not unilaterally return or reset to a conductive state once the fault condition is removed. Instead, the fuse 150 may be replaced by replacing the electrical module 136 that houses the fuse 150. Although FIG. 3 is shown and described with respect to a pair of fuses 150 within the cavity 218, in other embodiments the at least one electrical circuit device 112 within the electrical module 136 may be one or more relays, resisters, capacitors, or the like, in addition to, or instead of one or more fuses.

Optionally, the base 208 may define one or more partition walls that divide the cavity 218 into multiple discrete sub-cavities. In the illustrated embodiment, one partition wall 228 bisects the cavity 218 to define two sub-cavities 218A, 218B to the sides of the partition wall 228. The sub-cavities 218A, 218B are each sized to accommodate a corresponding one of the fuses 150. The mounting hole 212 is defined through the partition wall 228. Thus, the mounting hole 212 is spaced apart laterally from the fuses 150 (that define the electrical circuit devices 112 in the illustrated embodiment), so the fastener received in the mounting hole 212 does not interfere with the operation of the fuses 150 in the cavity 218.

In an embodiment, the cap 210 is configured to be non-removably bonded to the base 208 such that the at least one electrical circuit device 112 is permanently contained within the cavity 218 of the housing 202. Thus, the fuses 150 or other electrical circuit devices 112 within the housing 202 are not easily accessible, which reduces the risk of damage or electrical shock due to tampering. Since the electrical module 136 is disposed on the outer surface 118 of the tray 110, the electrical module 136 itself may be easily accessible to a mechanic/repairman. But, the electrical circuit devices 112 within the electrical module 136 are isolated from the mechanic by the housing 202 that seals around the electrical circuit devices 112. As used herein, "non-removably" indicates that the cap 210 is configured to not be removed from the base 208 using simple, conventional methods and/or tools used for uncoupling two dielectric bodies, such as screwdrivers, hand power, or the like. However, it is recognized that non-conventional tools for uncoupling two dielectric bodies, such as radial saws, may be successfully employed for separating the cap 210 from the base 208 after the cap 210 is bonded to the base 208.

The cap 210 may be bonded to the base 208 via one or more adhesives, welding, soldering, or the like. In the illustrated embodiment, the interface surface 226 of the cap 210 defines a raised bead 230 that extends in a closed loop. The bead 230 is configured to engage the top side 222 of the base 208. More specifically, the bead 230 engages portions of the top side 222 radially outside of (for example, surrounding) the cavity 218 such that the cavity 218 is radially interior of (and does not intersect) the closed loop defined by the bead 230. The bead 230 is configured to be welded to the top side 222 to seal the cavity 218. Bonding the cap 210 to the base 208 may hermetically seal the cavity 218 to prohibit ingress of debris, moisture, and other contaminants into the cavity 218, which may damage or degrade the electrical circuit devices 112 within.

Optionally, the cap 210 may include one or more cradles 232 that extend from the interface surface 226 of the cap 210. The cradles 232 in the illustrated embodiment align with the fuses 150 and have a concave engagement surface 234. When the cap 210 is placed on the top side 222 of the base 208, the two cradles 232 are received in the corresponding sub-cavities 218A, 218B. The concave engagement surfaces 234 complement the convex perimeters of the fuses 150 and may engage the fuses 150 to reduce or eliminate movement of the fuses 150 relative to the housing 202.

The at least one electrical circuit device 112 within the cavity 218 receives a supply of electrical current in order to operate. The operations of the at least one electrical circuit device 112 generate heat within the cavity 218. The heat may be significant, such as if the electrical circuit devices 112 are high current and/or voltage fuses 150, as illustrated. In an embodiment, the housing 202 is formed of a dielectric material that is both electrically insulative and thermally conductive. For example, the dielectric material of the housing 202 may be a ceramic material. Optionally, the dielectric material may include a high-thermal-conductivity filler dispersed within one or more plastics or other polymers. The high-thermal-conductivity filler may include one or more of aluminum oxide, aluminum nitride, boron nitride, silicon nitride, beryllium oxide, diamond, or the like. The thermally conductive properties of the dielectric material allow the housing 202 to transfer heat from within the cavity 218 through the walls to the external environment.

Referring now back to FIG. 3, the electrical module 136 optionally defines a heat sink 236 along at least one exterior surface of the housing 202. The heat sink 236 increases the dissipation of heat away from the electrical module 136 by increasing a surface area of the housing 202 that contacts ambient air flowing across the outer surface 118 of the tray 110. In the illustrated embodiment, the heat sink 236 is disposed on the cap 210. The heat sink 236 includes at least one elongate fin 238 that protrudes from a top surface 240 of the cap 210 (that is opposite the interface surface 226 shown in FIG. 4). Six fins 238 are shown in the illustrated embodiment, but the cap 210 may have other numbers and/or arrangements of fins 238 in other embodiments.

Figure 5:
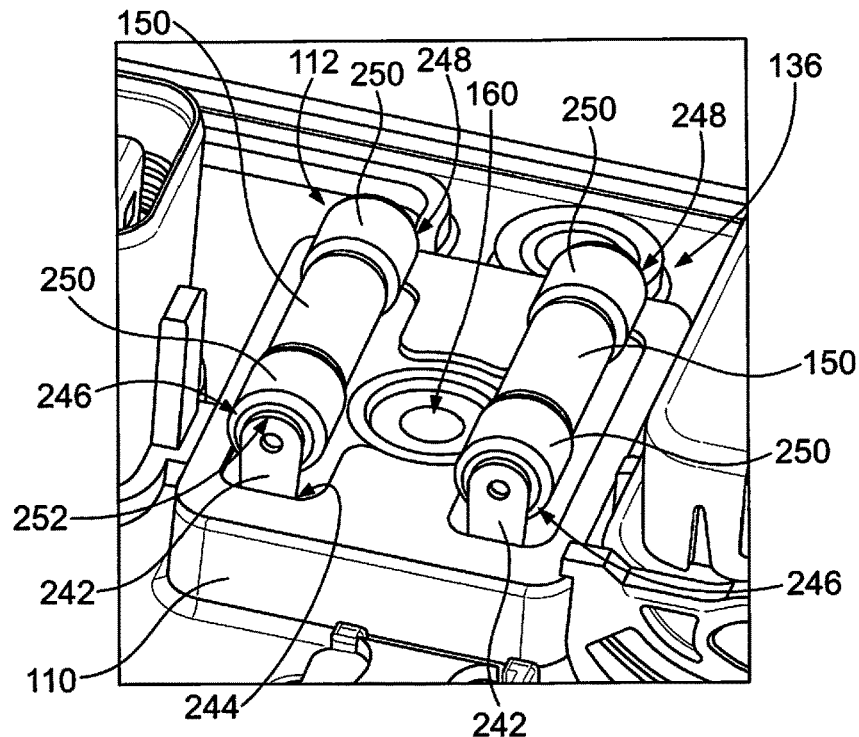
FIG. 5 is a perspective view of the electrical module according to the embodiment shown in FIG. 4 with a housing removed.

FIG. 5 is a perspective view of the electrical module 136 according to the embodiment shown in FIG. 4 with the housing 202 removed. In the illustrated embodiment, the at least one electrical circuit device 112 within the cavity 218 (shown in FIG. 4) is electrically connected to multiple blade terminals 242 within the cavity 218. The blade terminals 242 are planar conductors that provide a conductive signal path between the at least one electrical circuit device 112 and one or more corresponding electrical conductors 116 (shown in FIG. 2) along the inner surface 120 (FIG. 1) of the tray 110. For example, the blade terminals 242 extend from the housing 202 through the tray 110 via corresponding apertures 244 in the tray 110. In the illustrated embodiment, each of the two fuses 150 is cylindrical and extends between a first end 246 and a second end 248. The fuses 150 have ferrules 250 at both ends 246, 248. Each ferrule 250 of the two fuses 150 is electrically connected to a corresponding blade terminal 242. Therefore, the electrical module 136 in the illustrated embodiment includes four blade terminals 242, although only the two connected to the first ends 246 of the fuses 150 are visible. The blade terminals 242 extend between a proximal end 252 and a distal end 254 (shown in FIG. 6). The proximal end 252 is electrically connected to the corresponding ferrule 250 of the respective fuse 150. The blade terminals 242 extend through the tray 110 such that the distal end 254 of each blade terminal 242 is able to engage a corresponding electrical conductor 116 along the inner surface 120.

Figure 6:
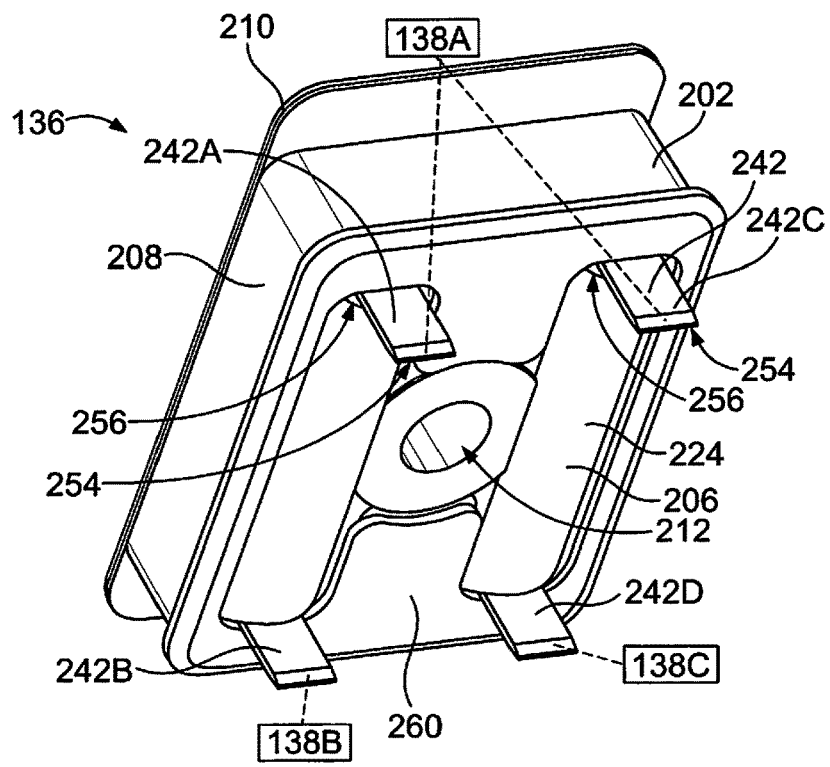
FIG. 6 is a bottom perspective view of the electrical module according to an embodiment.

FIG. 6 is a bottom perspective view of the electrical module 136 according to an embodiment. The bottom 206 of the housing 202 is defined by the bottom side 224 of the base 208. The blade terminals 242 of the electrical module 136 project outward from the housing 202 in order to extend through the apertures 244 (shown in FIG. 5) of the tray 110 (FIG. 5). More specifically, the blade terminals 242 project from the bottom side 224 of the base 208 via corresponding slots 256 defined in the bottom side 224. In the illustrated embodiment, the distal ends 254 of the blade terminals 242 are configured to engage and electrically connect to various bus bars 138 illustrated in FIG. 2. The distal ends 254 may be electrically connected to the corresponding bus bars 138 via terminals, receptacles, connectors, or the like.

In an embodiment, the two blade terminals 242 electrically connected to the same fuse 150 (shown in FIG. 5) are configured to be electrically connected to different bus bars 138. For example, a first blade terminal 242A and a second blade terminal 242B are connected to one of the two fuses 150, and a third blade terminal 242C and a fourth blade terminal 242D are connected to the other fuse 150. The distal end 254 of the first blade terminal 242A is configured to engage and electrically connect to a first bus bar 138A (shown schematically in FIG. 6), while the second blade terminal 242B is configured to electrically connect to a second bus bar 138B. The third blade terminal 242C electrically connects to the first bus bar 138A (at a spaced apart location relative to the first blade terminal 242A), while the fourth blade terminal 242D electrically connects to a third bus bar 138C. Since the two blade terminals 242 connected to the same respective fuse 150 electrically connect to different bus bars 138, the fuse 150 and the blade terminals 242 define a conductive circuit path between the two different bus bars 138. For example, the first and second blade terminals 242A, 242B and a first fuse 150 associated therewith define a circuit path between the first and second bus bars 138A, 138B. Similarly, the third and fourth blade terminals 242C, 242D and a second fuse 150 associated therewith define a circuit path between the first and third bus bars 138A, 138C.

In an embodiment, the electrical module 136 also includes a compressible gasket 260. The gasket 260 is disposed along the bottom 206 of the housing 202 at an interface 262 (shown in FIG. 3) defined between the bottom 206 (for example, the bottom side 224 of the base 208) and the raised platform 118A (FIG. 3) of the outer surface 118 (FIG. 3) of the tray 110 (FIG. 3). The gasket 260 may be formed of a compressible polymeric material, such as a polymer foam, a gel pad, or a deformable plastic. In the illustrated embodiment, the gasket 260 abuts the bottom side 224 of the base 208 and collectively surrounds the mounting hole 212 and the slots 256 that receive the blade terminals 242 therethrough. The gasket 260 defines a closed loop that collectively surrounds all of the openings in the bottom side 224. Thus, when the electrical module 136 is mounted to the tray 110 and the gasket 260 is compressed between the bottom side 224 of the base 208 and the outer surface 118 of the tray 110, the gasket 260 seals the interface 262 to prevent or at least prohibit contaminants, such as dirt and moisture from entering the cavity 218 (shown in FIG. 4) through the mounting hole 212 or one of the slots 256. The gasket 260 optionally may be a discrete part that is separate from the housing 202 and assembled onto the housing 202 using an adhesive, by an interference fit, or the like. Alternatively, the gasket 260 may be an integral layer of the housing 202 that is formed in-situ on the bottom side 224 of the housing 202.

Figure 7:
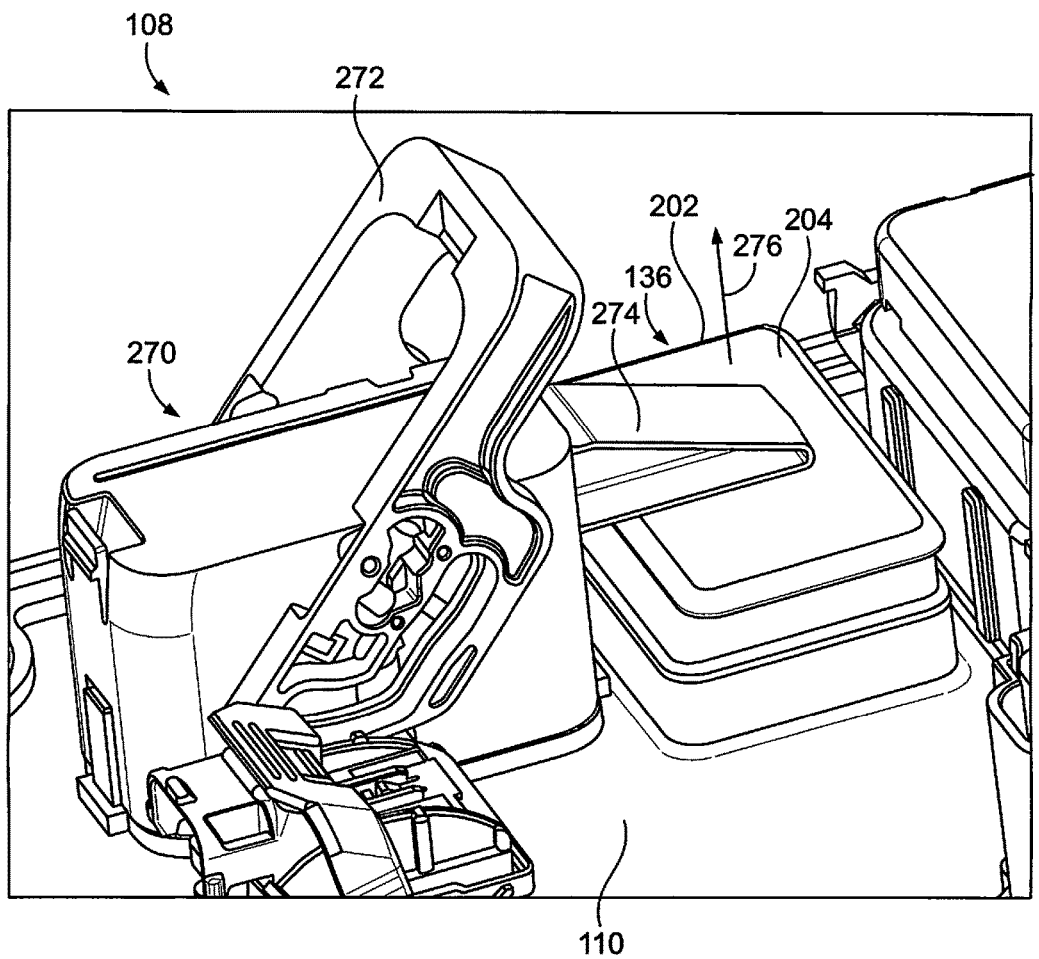
FIG. 7 is a perspective view of a portion of the battery distribution assembly according to an embodiment that includes a service disconnect module mounted proximate to the electrical module.

FIG. 7 is a perspective view of a portion of the BDA 108 according to an embodiment that includes a service disconnect module (SDM) 270 mounted proximate to the electrical module 136. The SDM 270 is selectively actuatable between an operable configuration and a non-operable configuration. The SDM 270 in the operable configuration closes or forms a power circuit to allow a supply of electrical current to (and through) the electrical module 136. The SDM 270 in the non-operable configuration opens or breaks the power circuit to prevent the supply of electrical current to the electrical module 136. The SDM 270 is in the non-operable configuration when the SDM 270 or a component thereof is not mounted to the tray 110. The SDM 270 may be in the operable configuration when the SDM 270 and all components thereof are mounted to the tray 110. The SDM 270 optionally includes a locking lever 272 that is configured to engage the tray 110 (or a component thereof). Pivoting or rotating the locking lever 272 in a closing direction relative to the tray 110 secures the SDM 270 to the tray 110. Optionally, as the locking lever 272 is rotated closed, the SDM 270 is pulled towards the tray 110 to a fully mounted position. Furthermore, as the locking lever 272 is rotated open in an opening direction, the SDM 270 is pushed away from the tray 110 such that the SDM 270 is no longer in the fully mounted position. The SDM 270 optionally is in the operable configuration only when the locking lever 272 is closed and the SDM 270 is in the fully mounted position.

In an embodiment, the SDM 270 includes an arm 274 that extends over the top 204 of the housing 202 of the electrical module 136. The arm 274 extends laterally to bridge a distance that separates the SDM 270 from the electrical module 136 along the tray 110. The arm 274 is configured to mechanically block the removal of the electrical module 136 from the tray 110 when the SDM 270 is in the operable configuration. For example, the electrical module 136 may be configured to be removed or disconnected from the tray 110 by moving the electrical module 136 in a disconnecting direction 276 relative to the tray 110. The arm 274 engages the top 204 of the housing 202 to restrict such movement of the electrical module 136 in the disconnecting direction 276. Although one arm 274 is shown, the SDM 270 may include multiple arms that extend over the housing 202. The housing 202 in the illustrated embodiment lacks the fins 238 (shown in FIG. 3), but the arm 274 may be configured to extend over or between the fins 238 of the housing 202 of the embodiment shown in FIG. 3, such that there is clearance between the arm 273 and the fins 238.

The arm 274 in the illustrated embodiment extends over the mounting hole 212 (shown in FIG. 3) of the housing 202 that is used to couple the electrical module 136 to the tray 110. Thus, the arm 274 also may block access to the fastener within the mounting hole 212. In an embodiment, the SDM 270 must be disconnected from the tray 110 in order to move the arm 274 and relieve the impediment to the electrical module 136 caused by the arm 274. Moving the arm 274 provides access the fastener in the mounting hole 212 and the ability to move the electrical module 136 in the disconnecting direction 276 (after unfastening the fastener). Since the SDM 270 is configured to be in the non-operable configuration when disconnected from the tray 110, the electrical module 136 does not receive electrical current when the arm 274 is not in the blocking position extending over the housing 202. The arm 274 of the SDM 270 is a safety feature that prevents the electrical module 136 from being able to be removed from the tray 110 while the SDM 270 is in the operable configuration and current is supplied to the electrical module 136. This safety feature may be beneficial to reduce damage to electrical components due to sparking and to reduce injuries to persons due to electrical shocks.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical module configured to be coupled to a tray of a battery distribution assembly, the electrical module comprising:
    a housing disposed along an outer surface of the tray, the housing including a base and a cap, the cap engaging a top side of the base to define a cavity between the cap and the base;
    at least one electrical circuit device disposed within the cavity of the housing; and
    multiple terminals electrically connected to the at least one electrical circuit device within the housing, the terminals projecting from the housing and extending through corresponding apertures in the tray to electrically connect to one or more electrical conductors disposed along an inner surface of the tray,
    wherein the cap is non-removably bonded to the base such that the at least one electrical circuit device is permanently contained within the cavity.

2. The electrical module of claim 1, wherein the at least one electrical circuit device is one or more high current fuses, low current fuses, power relays, resisters, or capacitors.

3. The electrical module of claim 1, wherein the cavity is defined along the top side of the base and extends towards a bottom side of the base.

4. The electrical module of claim 1, wherein an interface surface of the cap defines a raised bead extending in a closed loop, the bead engaging the top side of the base outside of the cavity such that the cavity is radially interior of the bead, the bead configured to be welded to the top side of the base to hermetically seal the cavity.

5. The electrical module of claim 1, wherein the housing is formed of a dielectric material that is electrically insulative and thermally conductive.

6. The electrical module of claim 1, wherein the housing includes a heat sink disposed along at least one exterior surface of the housing.

7. The electrical module of claim 1, wherein the terminals are configured to electrically connect to bus bars disposed along the inner surface of the tray, the bus bars defining the one or more electrical conductors.

8. The electrical module of claim 1, wherein the cap defines a top of the housing and the base defines a bottom of the housing, the housing including a mounting hole extending fully through the housing from the top to the bottom thereof, the mounting hole spaced apart laterally from the at least one electrical circuit device in the cavity, the mounting hole configured to receive a fastener therethrough for coupling the electrical module to the outer surface of the tray.

9. The electrical module of claim 1, further comprising a compressible gasket disposed along a bottom side of the base at an interface defined between the housing and the outer surface of the tray, the gasket collectively surrounding the terminals extending from the housing to seal the interface.

10. An electrical module configured to be coupled to an outer surface of a tray of a battery distribution assembly, the electrical module comprising:
  at least one fuse;
  a housing including a base and a cap, the base extends between a top side and a bottom side, the housing defining a cavity that receives the at least one fuse therein, the cavity extending at least partially through the base from the top side towards the bottom side, the cap being affixed to the top side of the base to seal the cavity; and
  multiple terminals electrically connected to the at least one fuse within the housing, the terminals projecting from the housing and extending through corresponding apertures in the tray to electrically connect to one or more bus bars disposed along an inner surface of the tray,
  wherein the cap is non-removably bonded to the base such that the at least one fuse is permanently contained within the cavity of the housing.

11. The electrical module of claim 1, wherein the cap has an interface surface that engages the top side of the base and a top surface that is opposite the interface surface, the cap including multiple elongate fins protruding from the top surface thereof to define a heat sink.

12. An electrical module configured to be coupled to a tray of a battery distribution assembly, the electrical module comprising:
  a housing including a base and a cap, the base having a top side and a bottom side that is opposite the top side, the cap having an interface surface and a top surface that is opposite the interface surface, the interface surface of the cap engaging the top side of the base to define and enclose a cavity between the cap and the base, the cap including multiple elongate fins protruding from the top surface thereof to define a heat sink;
  at least one electrical circuit device disposed within the cavity of the housing; and
  multiple terminals electrically connected to the at least one electrical circuit device within the cavity, the terminals projecting from the base of the housing and extending through corresponding apertures in the tray to electrically connect to one or more electrical conductors disposed along an inner surface of the tray of the battery distribution assembly,
  wherein the interface surface of the cap is non-removably bonded to the top side of the base such that the at least one electrical circuit device is permanently contained within the cavity of the housing.

13. The electrical module of claim 12, wherein the housing defines a mounting hole extending through both the cap and the base, the mounting hole spaced apart laterally from the at least one electrical circuit device in the cavity, the mounting hole configured to receive a fastener therethrough for coupling the electrical module to the tray of the battery distribution assembly.

14. The electrical module of claim 13, wherein the at least one electrical circuit device within the cavity includes two of the electrical circuit devices, and the mounting hole is disposed between the two electrical circuit devices.

15. The electrical module of claim 12, wherein the at least one electrical circuit device is one or more high current fuses, low current fuses, power relays, resisters, or capacitors.

16. The electrical module of claim 12, wherein the cap and the base of the housing are formed of a dielectric material that is electrically insulative and thermally conductive.

* * * * *